United States Patent

Jeon et al.

Patent Number: 6,071,350
Date of Patent: *Jun. 6, 2000

[54] SEMICONDUCTOR DEVICE MANUFACTURING APPARATUS EMPLOYING VACUUM SYSTEM

[75] Inventors: Jae-sun Jeon, Suwon; Won-yeong Kim, Yongin; Yun-mo Yang; Seung-ki Chae, both of Seoul, all of Rep. of Korea

[73] Assignee: Samsung Electronics Co., Ltd., Suwon, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/980,789

[22] Filed: Dec. 1, 1997

Related U.S. Application Data

[62] Division of application No. 08/752,954, Nov. 20, 1996, Pat. No. 5,833,425.

[30] Foreign Application Priority Data

Nov. 21, 1995 [KR] Rep. of Korea ........................ 95-42623

[51] Int. Cl.[7] ..................................................... C23C 16/46
[52] U.S. Cl. ............................. 118/719; 118/50; 118/724; 118/733; 251/305; 414/217; 414/939
[58] Field of Search .............................. 118/50, 719, 724, 118/733; 414/217, 939; 251/305

[56] References Cited

U.S. PATENT DOCUMENTS

| | | |
|---|---|---|
| 4,739,787 | 4/1988 | Stoltenberg . |
| 5,308,989 | 5/1994 | Brubaker . |
| 5,314,541 | 5/1994 | Saito et al. . |

FOREIGN PATENT DOCUMENTS 385 709 A2   9/1990   European Pat. Off. .

OTHER PUBLICATIONS

Benjamin et al., "Condensation–Induced Particle Formation during Vacuum Pump Down," Electrochem. Soc., vol. 140, No. 5, May 1993, pp. 1463–1468.

Primary Examiner—Leo B. Tentoni
Attorney, Agent, or Firm—Jones Volentine, LLP

[57] ABSTRACT

An apparatus for manufacturing a semiconductor device employs a vacuum system, in which a heating source is installed in a predetermined portion of a venting-gas inlet. A venting-speed controlling valve is installed in a predetermined portion of an exhaust pipe, for controlling the speed of gas flowing from a load lock chamber to a pump by controlling the opening and closing thereof. An exhaust pipe may have a main pipe with different diameters in different portions to reduce the venting speed. Accordingly, condensation-induced particle formation can be reduced by thus preventing adiabatic expansion of the gas in a load lock chamber.

6 Claims, 6 Drawing Sheets

SEMICONDUCTOR DEVICE MANUFACTURING APPARATUS EMPLOYING VACUUM SYSTEM

CROSS REFERENCE TO RELATED APPLICATIONS

The present application is a divisional application of Ser. No. 08/752,954, which was filed on Nov. 20, 1996, and which issued as U.S. Pat. No. 5,833,425, on Nov. 10, 1998.

BACKGROUND OF THE INVENTION

The present invention relates to an apparatus for manufacturing a semiconductor device. More particularly, it relates to an apparatus for manufacturing a semiconductor device, wherein the apparatus employs a vacuum system.

In the fabrication of a semiconductor device using an apparatus employing a vacuum system, particles are formed during the pressure-reduction (pump down) of a process chamber and the particles formed thus settle on wafers being processed therein. Such particulate contamination of a semiconductor wafer significantly lowers the product yield and the reliability of a semiconductor device. This problem becomes more severe with increasing wafer diameters and with higher integration levels.

Particle formation during pressure-reduction or venting is attributed to a condensation mechanism caused by an adiabatic expansion of gas (see "Condensation-Induced Particle Formation During Vacuum Pump Down" by Yan Ye et al., *Journal of the Electrochemical Society*, Vol. 140, No. 5, pp. 1463–1468, May 1993). According to the suggested mechanism, a rapid drop in the pressure of a process chamber causes gas in the chamber to undergo adiabatic expansion and causes its temperature to fall rapidly. The gas is simultaneously condensed into water droplets. During droplet formation, such gases in the air as $SO_2$, $O_3$, $H_2O$ and other gaseous impurities tend to diffuse into the droplets and thus become absorbed.

Due to the thermal capacity of the chamber walls being greater than that of the droplets, which are formed as described above, the inner surface temperature of the chamber decreases more slowly than does the temperature of the droplets. This resulting temperature difference causes heat to be transferred from the chamber to the droplets. Such heat transfer leads to a cycle of heating, evaporation and condensation of the droplets and causes an increase in the concentration of impurities in the liquid droplets. During the concentrated liquid phase, when the concentration of $H_2O_2$ in the liquid is high enough, the formation of sulfuric acid droplets occurs. Namely, $H_2O_2$ of the liquid quickly reacts with $SO_2$ from the liquid or air to form sulfuric acid and, as the droplets continue their evaporation/condensation cycle, residue particles which are spherical in shape and contain mainly sulfuric acid are formed.

The main elemental components of the residue particles, which are formed by the evaporation/condensation cycles are carbon, sulfur and oxygen. The residue particles are quite stable thermodynamically and do not completely evaporate even upon heating to temperatures as high as 180° C.

As the size of the process chamber is decreased the relative humidity of the gas increases and depressurizing speed or venting speed also increases. This leads to an increase in the number of condensation-induced particles that are formed.

FIG. 1 is a schematic view of an ion-implanting apparatus, in a conventional apparatus for manufacturing semiconductor devices, which employs a vacuum system. In FIG. 1, a reference numeral 10 denotes a process chamber for ion-implanting a semiconductor wafer therein; reference numeral 20 denotes two load lock chambers communicating with predetermined portions of the process chamber 10, for loading wafers to be transferred to the process chamber therein; reference numeral 30 denotes an isolation valve installed between the process chamber 10 and each of the load lock chambers 20, for providing isolation of the process chamber 10 from the load lock chambers 20; reference numeral 40 denotes a pump for reducing the pressure of the load lock chambers 20 to transfer the wafers to the process chamber 10 in a state of vacuum; reference numeral 50 denotes an exhaust pipe having two sub-pipes A connected to the respective load lock chambers 20 and a main pipe B of which one end is connected to the sub-pipes A and the other end is connected to the pump 40; and reference numeral 60 denotes two shut-off valves, one of which is installed in a predetermined portion in each of the sub-pipes A, for providing a shut-off of the flow of gas from the load lock chambers 20 to pump 40.

In the device of FIG. 1, an air valve, which is opened and closed depending on gas pressure, is usually used as the shut-off valve 60. The diameter of the main pipe B is larger than that of the sub-pipes A, since gas flowing from the load lock chambers 20 is collected in and passed through the main pipe B. Also, reference numeral 70 denotes an inlet for injecting venting-gas into the load lock chambers 20. The operation of a conventional apparatus for manufacturing a semiconductor device by employing a vacuum system will now be described in further detail while referring to FIG. 1.

The exhaust pipe 50 installed between the shut-off valves 60 and pump 40 is maintained in a low vacuum of about $10^{-3}$ Torr. Wafers are then loaded in the load lock chambers 20, and the shut-off valves 60 are opened to drop the pressure of the load lock chambers 20 to about $10^{-3}$ Torr. Thereafter, the wafers are transferred to the process chamber 10 by opening the isolation valves 30. Such process chamber 10 is maintained at a high vacuum of about $10^{-6}$ Torr during the processing of wafers.

The load lock chambers 20 are set to the lower vacuum to avoid a sudden turbulence of gas and to reduce the preliminary formation of particles before the wafers are transferred to the process chamber 10. Such formation of particles is minimized by reducing the difference between the high vacuum of the process chamber 10 and atmospheric pressure of the load lock chambers 20.

FIG. 2 is a sectional magnified view of the air valve which is used as a shut-off valve 60. In FIG. 2, a reference numeral 100 denotes a cylindrical case having a first orifice on its side and a second orifice on its base; reference numeral 200 denotes a board installed in a predetermined location inside of the case 100 to divide it into an upper portion and a lower portion and having a hole in the center thereof for communicating the lower portion of the case 100 with the upper portion of the case 100; reference numeral 300 denotes a bellows fixed to the board 200 and surrounding the center hole thereof which is sealed by being attachably fixed to the lower surface of the board and having an O-ring on the lower end portion thereof, to provide a means for opening and closing the second orifice at the base of the case 100; reference numeral 500 denotes an elastic rubber boot installed on the internal upper surface of the case 100 and extending in a convex manner in the direction of the lower portion of the case 100; reference numeral 600 denotes a spring support fixed to the convex surface of the rubber boot 500, one portion thereof being inserted into the hole of the board 200; reference numeral 700 denotes a spring, one end of which is fixed to a base 400 of the bellows 300 and the other end of which is fixed to the spring support 600; reference numeral 800 denotes an air inlet communicating with a side portion of the upper portion of the case 100; and reference numeral 900 denotes the flow of gas from the load lock chambers 20 via the first orifice located on the side of the case 100 to the pump 40 (FIG. 1) via the second orifice located in the base of the case 100.

If the pressure of air injected through the air inlet 800 is below a predetermined value, the second orifice located at the base of the case 100 is opened by the base 400 of the bellows 300. If the air pressure is greater than or equal to the predetermined pressure, the convex end portion of the rubber boot 500 is pushed upward, vertically contracting the bellows 300 and thus closing the second orifice at the base of the case 100. Since the second orifice is quickly opened, the pressure of the load lock chambers 20 also rapidly drops.

FIGS. 3A and 3B show scanning electron microspectroscopy (SEM) photographs of particles formed in the load lock chambers 20. The particles are about 0.3 $\mu$m to 3.7 $\mu$m in diameter and generally spherical in shape.

FIG. 4 illustrates the result obtained by analyzing the components of the particles of FIGS. 3A and 3B by Auger electron spectroscopy (AES). The main components, as shown by the elemental analysis graph of FIG. 4, are sulfur, oxygen and carbon.

As described above, in the conventional apparatus for manufacturing a semiconductor device by employing a vacuum system, gas condensation is found to be the cause of particle formation. This conclusion is supported by an analysis of the shape and components of particles generated in the load lock chambers, as suggested by Yan Ye et al. In other words, as the shut-off valves installed on the exhaust pipe for exhausting the load lock chambers of gas are rapidly opened, the pressure of the load lock chambers drops quickly. Therefore, particle formation is attributed to adiabatic expansion of the gas in the load lock chambers.

By the same mechanism as described above, the adiabatic expansion of venting-gas also produces particles during the venting of the load lock chambers.

SUMMARY OF THE INVENTION

One object of the present invention is to provide an apparatus for manufacturing a semiconductor device, wherein the apparatus can reduce condensation-induced particle formation by preventing adiabatic expansion of the gas in a load lock chamber of the apparatus.

To achieve one aspect of the above object, there is provided an apparatus according to a first embodiment of the present invention for manufacturing a semiconductor device, said apparatus comprising: a process chamber for fabricating a semiconductor device therein; a load lock chamber communicating with a predetermined portion of the process chamber, for loading a semiconductor wafer to be transferred to the process chamber therein; a pump for reducing the pressure of the load lock chamber; an exhaust pipe connecting the load lock chamber with the pump, for exhausting gas of the load lock chamber; and a valve installed in a predetermined portion of the exhaust pipe, wherein the valve is a venting speed controlling valve for controlling the speed of gas flowing from the load lock chamber to the pump.

To achieve another aspect of the above object, there is provided an apparatus according to a second embodiment of the present invention for manufacturing a semiconductor device, said apparatus comprising: a process chamber for fabricating a semiconductor device therein; a load lock chamber communicating with the process chamber, for loading a semiconductor wafer to be transferred to the process chamber therein; and a venting-gas inlet for injecting venting gas into the load lock chamber, wherein the venting-gas inlet is provided with a heating source installed in a predetermined portion thereof, for heating venting gas injected into the load lock chamber.

To achieve yet another aspect of the above object, there is provided an apparatus according to a third embodiment of the present invention for manufacturing a semiconductor device, said apparatus comprising: a process chamber for fabricating a semiconductor device therein; a plurality of load lock chambers communicating with predetermined portions of the process chamber, for loading semiconductor wafers to be transferred to the process chamber therein; a pump for reducing the pressure of the plurality of load lock chambers; an exhaust pipe connecting the load lock chambers with the pump, for exhausting gas of the load lock chambers, the exhaust pipe comprising a plurality of sub-pipes, each sub-pipe being connected to each load lock chamber, and a main pipe having a first predetermined portion different from a second portion in diameter, one end thereof being connected to the plurality of sub-pipes and the other end being connected to the pump; and a valve installed in a predetermined portion of the exhaust pipe.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Embodiment 1

Figure 1:
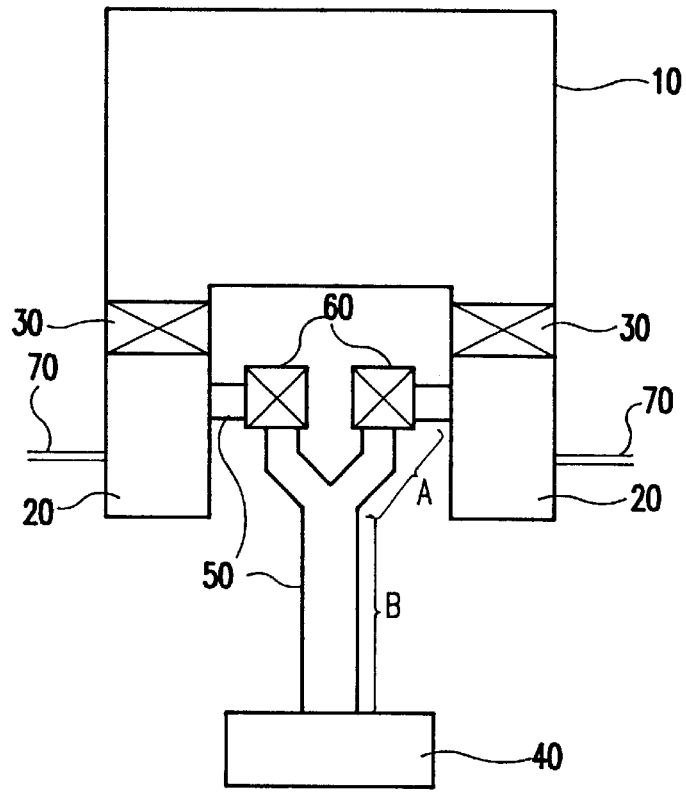
FIG. 1 is a schematic view of a conventional apparatus for manufacturing a semiconductor device, wherein the apparatus employs a vacuum system.
Figure 2:
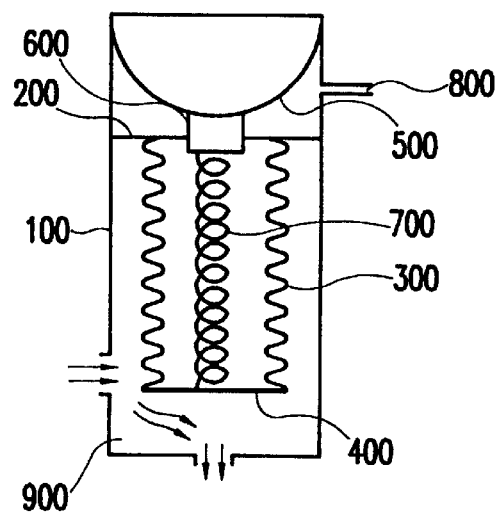
FIG. 2 is a sectional view of an air valve, which is used as a shut-off valve as depicted in FIG. 1.
Figure 3A:
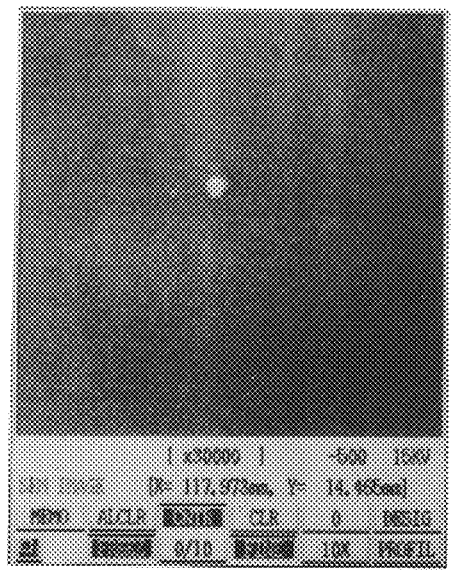
FIGS. 3A and 3B show SEM photographs of particles generated in the load lock chambers of FIG. 1.
Figure 3B:
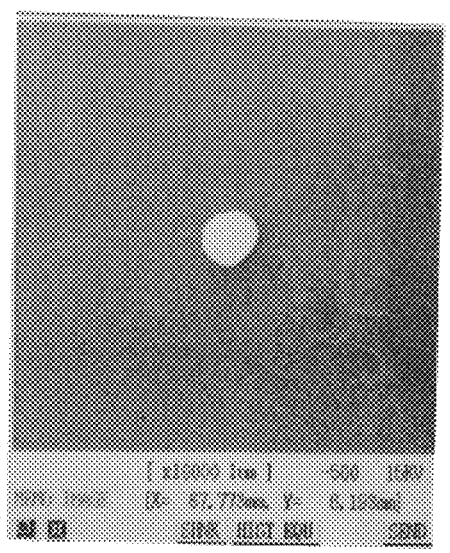
Figure 4:
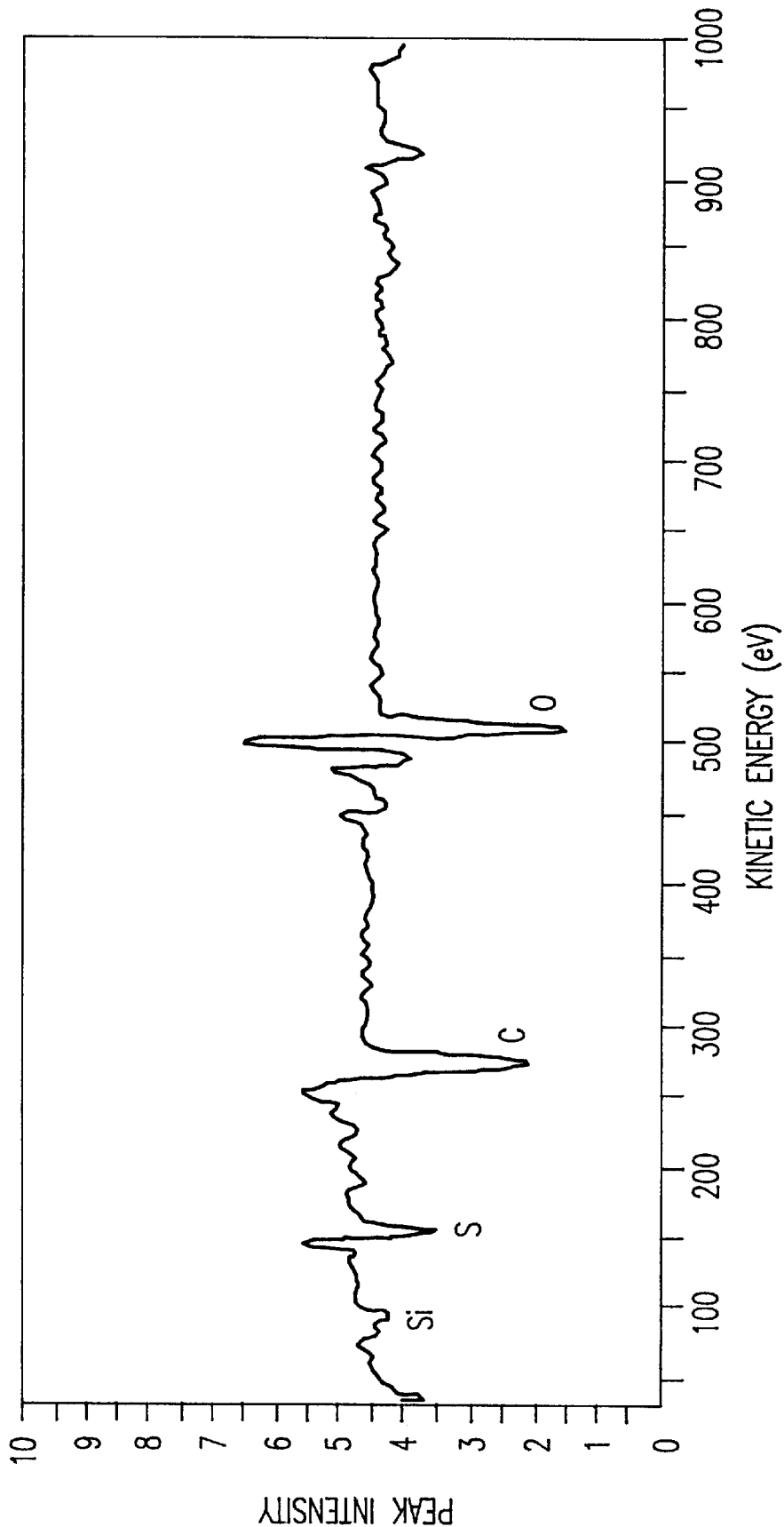
FIG. 4 shows the result from an AES analysis of the components of the particles of FIGS. 3A and 3B.
Figure 5:
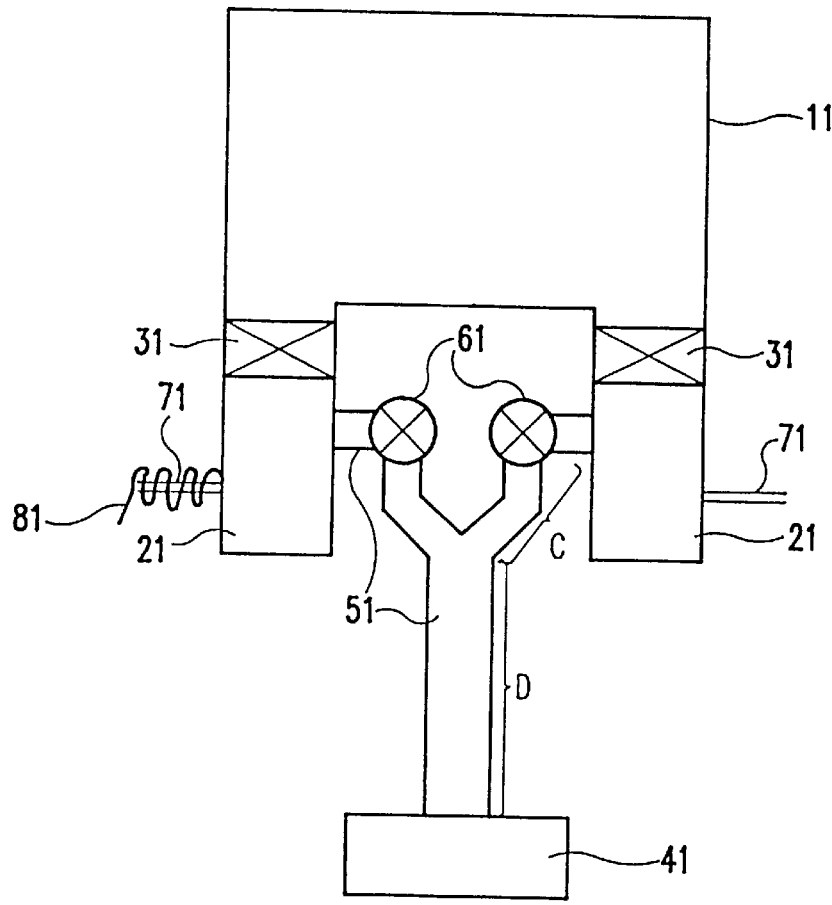
FIG. 5 is a schematic view of an apparatus according to an embodiment of the present invention for manufacturing a semiconductor device.

FIG. 5 is a schematic view of a semiconductor device manufacturing apparatus, especially, an ion-implanting device, according to a first embodiment of the present invention. Here, a reference numeral 11 denotes a process chamber for ion-implanting a semiconductor wafer therein; reference numeral 21 denotes a plurality of, for example, two load lock chambers communicating with predetermined portions of the process chamber 11, for loading semiconductor wafers to be transferred to the process chamber therein; reference numeral 31 denotes an isolation valve disposed between the process chamber 11 and each load lock chamber 21, for isolating of the process chamber 11 from the load lock chambers 21; reference numeral 41 denotes a pump for reducing the pressure of the load lock chambers 21 to transfer the wafers from the load lock chambers 21 to the process chamber 11 in vacuum; reference numeral 51 denotes an exhaust pipe having a plurality (e.g., two) of sub-pipes C, each sub-pipe being connected to each load lock chamber 21, and a main pipe D with a first end which is connected to the sub-pipes C and having a second end which is connected to pump 41; reference numeral 61 denotes a venting speed controlling valve installed to the exhaust pipe 51, for controlling the speed of the flow of gas from the load lock chambers 21 to the pump 41 by controlling the opening thereof; and reference numeral 71 denotes a venting-gas inlet for injecting venting-gas into each load lock chamber 21.

Preferably, the diameter of main pipe D is larger than that of the sub-pipes C, since gas flowing from the load lock chambers 21 are collected in and pass through the main pipe D. Further, a throttle valve may be used as the venting speed controlling valve 61.

According to this embodiment, condensation-induced particle formation can be reduced by steadily increasing a venting speed with the venting speed controlling valve 61. In such a manner adiabatic expansion of gas is prevented by avoiding a rapid drop of pressure in the load lock chambers 21. In addition, condensation-induced particle formation can also be reduced by providing a heating source, for example, heater line 81 installed in a predetermined portion of the venting gas inlet to heat up gas injected during a venting process. Such a heating procedure is adapted to reduce the relative humidity of the venting gas and to consequently reduce liquid produced by condensation of water vapor in the gas.

Figure 6:
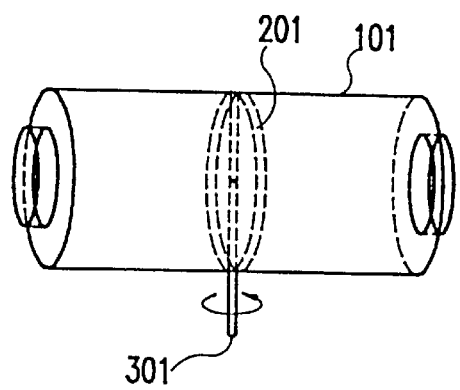
FIG. 6 is a schematic view of a throttle valve used as a venting speed controlling valve as shown in FIG. 5.

FIG. 6 is a schematic view of a throttle valve used as the venting-speed controlling valve 61. In FIG. 6, a reference numeral 101 denotes a cylindrical case having orifices in the sides thereof, through which the cylindrical case 101 is connected to the exhaust pipe 51 of FIG. 5; reference numeral 201 denotes a disk-shaped rotational plate for dividing case 101 into left and right portions; and reference numeral 301 denotes a rotational shaft being rotated by a motor (not shown) which is connected with the rotational plate 201 and adapted to vertically penetrate through the case 101 and pass through the center of the rotational plate 201. Thus, the rotational plate 201 is rotated by the rotation of the rotational shaft 301 with the rotational shaft serving as the axis. The speed of gas flowing from the load lock chambers 21 to pump 41 (FIG. 5) can be controlled by varying the rotational speed of the rotational shaft 301.

Embodiment 2

Figure 7:
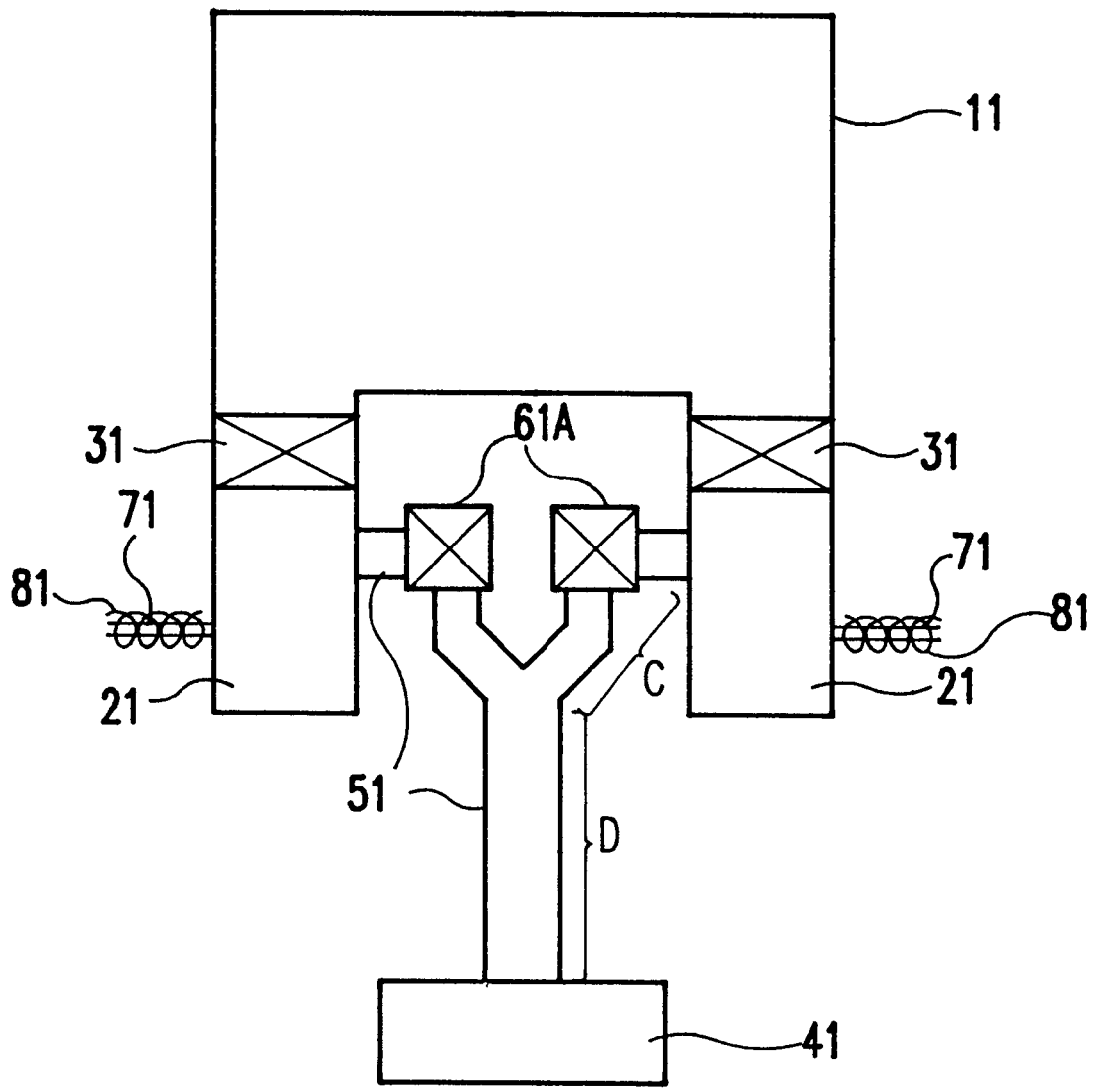
FIG. 7 is a schematic view of an apparatus according to a second embodiment of the present invention for manufacturing a semiconductor device.

FIG. 7 is a schematic view of an apparatus according to a second embodiment of the present invention for manufacturing a semiconductor device, especially a device produced by using an ion-implanting process step. Like reference numerals of FIG. 5 denote the same elements in FIG. 7. Reference numeral 61A denotes a shut-off valve installed in a predetermined portion of the sub-pipe C, to provide a means to shut-off the flow of gas from the load lock chambers 21 to the pump 41. An air valve, for example, can be used as a shut-off valve. A reference numeral 81 denotes a heating source installed in a predetermined portion of the venting-gas inlet 71. A heating line, for example, can be used as the heating source. The heating source 81 heats up venting gas being injected into the load lock chambers 21 to decrease the relative humidity of the venting gas. Hence, this heating procedure reduces the formation of condensation-induced particles in the load lock chambers 21.

Embodiment 3

Figure 8:
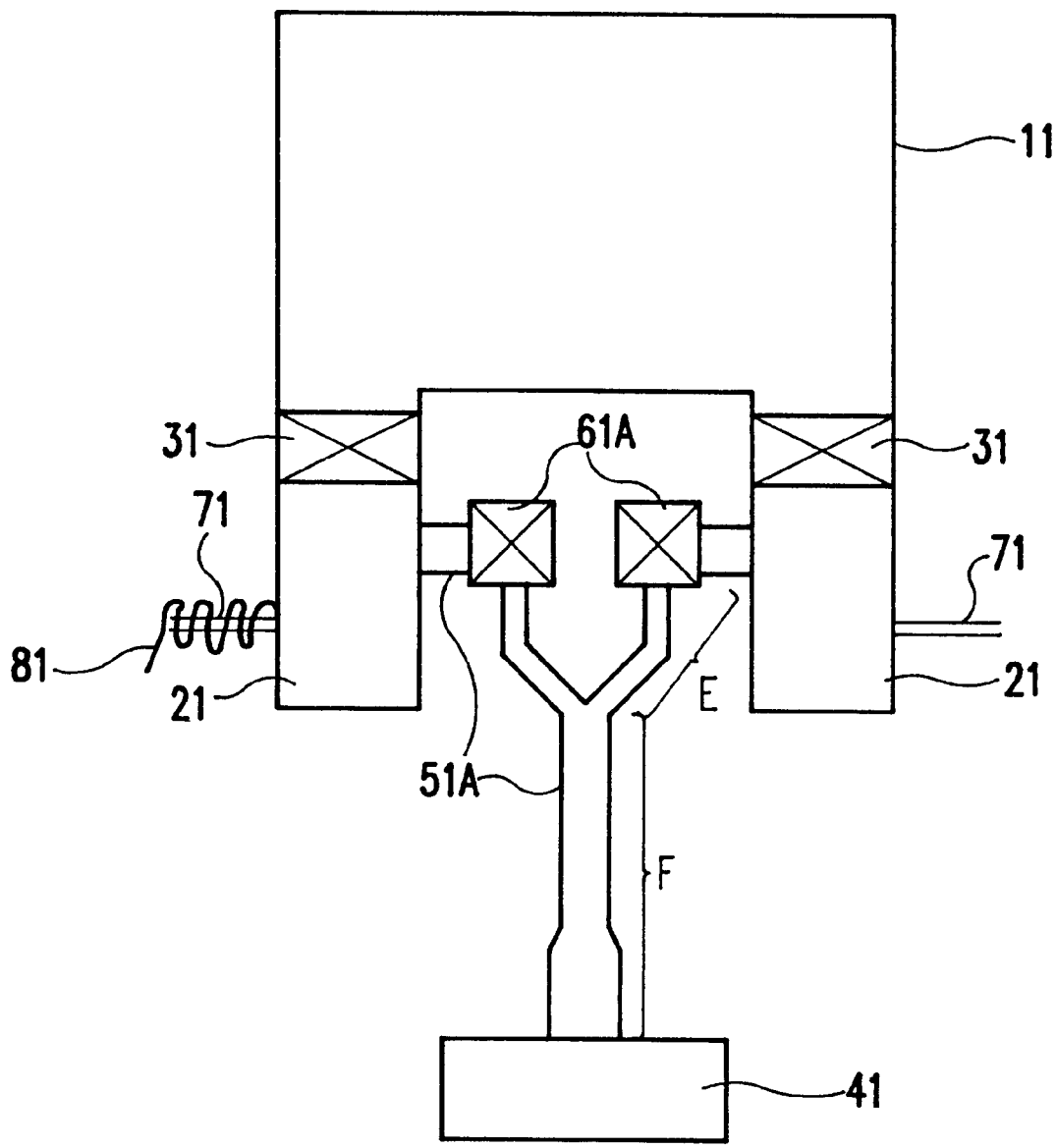
FIG. 8 is a schematic view of an apparatus according to a third embodiment of the present invention for manufacturing a semiconductor device.

FIG. 8 is a schematic view of an apparatus according to a third embodiment of the present invention for manufacturing a semiconductor device, especially a device produced by using an ion-implanting process step. Like reference numerals of FIG. 5 denote the same elements in FIG. 8. A reference numeral 51A denotes an exhaust pipe having a plurality of pipes, for example, two sub-pipes E, and a main pipe F. In FIG. 8, each sub-pipe is connected to each load lock chamber 21. The main pipe F has a first end connected to the sub-pipes E and a second end connected to the pump 41. Main pipe F has a first diameter for a predetermined length from the first portion where the plurality of sub-pipes meet and has a second diameter in the second portion connected to the pump 41.

Preferably, the main pipe F has a first diameter for a predetermined length from where the sub-pipes E meet, while it has a second diameter larger than the first diameter in the second portion thereof. The portion of main pipe F having the first diameter is just an example of applying such a concept. Thus, the position of the first diameter portion can be modified, if necessary, to achieve optimum results. Further, the first diameter is preferably larger than that of the sub-pipes E.

A reference numeral 61A denotes a shut-off valve installed in a predetermined portion of the sub-pipes E to provide a means to shut-off the flow of gas from the load lock chambers 21 to the pump 41. An air valve can be used as the shut-off valve. The shut-off valve 61A is preferably installed in a predetermined portion of the sub-pipes E. Therefore, even though the shut-off valves 61A can be opened suddenly, the speed of exhausted gas can be reduced due to the portion of the first diameter in the main pipe F. As a result, condensation-induced particle formation can be reduced by preventing an adiabatic expansion of gas caused by a rapid drop in the pressure of the load lock chambers 21.

In addition, condensation-induced particle formation can also be reduced by providing a heating source (similar to that shown in FIG. 7), for example, a heating line 81, in a predetermined portion of the venting-gas inlet. This further minimizes the formation of undesired particles by reducing the relative humidity of the venting gas and consequently reducing the amount of water vapor available to condense into droplets.

As described above, according to the preferred embodiments of the present invention, condensation-induced particle formation can be reduced by preventing adiabatic expansion of gas.

While this invention has been described with respect to that which is presently considered to be the most practical and preferred embodiments, the invention is not limited to such disclosed embodiments. It is clearly understood that many variations can be possible within the scope and spirit of the present invention by any one skilled in the art. In fact, it is intended that the present invention cover various modifications and equivalent arrangements within the spirit and scope of the appended claims.

What is claimed is:

1. An apparatus for manufacturing a semiconductor, said apparatus comprising:

a process chamber for fabricating a semiconductor device therein;

a plurality of load lock chambers adapted for communicating with predetermined portions of said process chamber, and adapted for loading semiconductor wafers to be transferred to within said process chamber;

a pump adapted for reducing the pressure of said plurality of load lock chambers;

an exhaust pipe connecting said load lock chambers with said pump, and adapted for exhausting gas of said load lock chambers, said exhaust pipe comprising a main pipe and a plurality of sub-pipes, wherein each sub-pipe has a first end connected to one of said plurality of load lock chambers, and a second end connected to said main pipe, and said main pipe has a first portion having a first diameter and a second portion having a second diameter larger than said first diameter, said first portion comprising an unbranched section of the main pipe extending from a point where the main pipe branches to connect to said plurality of sub-pipes, and the second portion comprising an unbranched section of the main pipe extending from the first section to a point where the main pipe connects to said pump; and a valve installed in a predetermined portion of said exhaust pipe.

2. An apparatus as claimed in claim 1, for manufacturing a semiconductor device, wherein said first portion of the main pipe has a predetermined length.

3. An apparatus as claimed in claim 1, for manufacturing a semiconductor device, wherein said valve is installed in a predetermined portion of a sub-pipe.

4. An apparatus as claimed in claim 1, for manufacturing a semiconductor device, wherein each of said load lock chambers comprises:

a venting-gas inlet adapted for injecting venting gas into said load lock; and a heating source installed in a predetermined portion of said venting-gas inlet.

5. An apparatus as claimed in claim 1, for manufacturing a semiconductor device, wherein said valve is a shut-off valve.

6. An apparatus as claimed in claim 5, for manufacturing a semiconductor device, wherein said shut-off valve is an air valve.

* * * * *